(12) United States Patent
Cao et al.

(10) Patent No.: US 10,929,590 B2
(45) Date of Patent: Feb. 23, 2021

(54) VERIFICATION OF PHOTONIC INTEGRATED CIRCUITS

(71) Applicant: Mentor Graphics Corporation, Wilsonville, OR (US)

(72) Inventors: Ruping Cao, Saint Martin d'Hères (FR); John G. Ferguson, Tualatin, OR (US); John D. Cayo, Garland, TX (US); Alexandre Arriordaz, L'Isle d'Abeau (FR)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 16/217,956

(22) Filed: Dec. 12, 2018

(65) Prior Publication Data

US 2019/0114384 A1    Apr. 18, 2019

Related U.S. Application Data

(62) Division of application No. 14/693,851, filed on Apr. 22, 2015, now Pat. No. 10,185,799.

(60) Provisional application No. 61/982,329, filed on Apr. 22, 2014, provisional application No. 62/151,240, filed on Apr. 22, 2015.

(51) Int. Cl.
*G06F 30/398* (2020.01)

(52) U.S. Cl.
CPC .................. *G06F 30/398* (2020.01)

(58) Field of Classification Search
USPC ........................................................ 716/112
See application file for complete search history.

(56) References Cited

U.S. PATENT DOCUMENTS

| | | | |
|---|---|---|---|
| 2002/0056070 A1* | 5/2002 | Tanaka ................. | H01L 23/5222 716/115 |
| 2004/0014253 A1* | 1/2004 | Gupta .............. | A61B 17/12022 438/48 |
| 2004/0063000 A1* | 4/2004 | Maurer ................... | G06F 30/39 430/5 |
| 2005/0076316 A1* | 4/2005 | Pierrat ................ | G06F 17/5036 716/52 |
| 2005/0118515 A1* | 6/2005 | Progler .................. | B82Y 10/00 430/5 |
| 2008/0010623 A1* | 1/2008 | Koizumi ............. | G06F 17/5081 716/52 |
| 2008/0169867 A1* | 7/2008 | Abadeer ................... | G05F 1/56 327/540 |
| 2008/0250384 A1* | 10/2008 | Duffy .................. | G03F 7/70525 716/55 |
| 2012/0168907 A1* | 7/2012 | Malladi ............... | H01L 29/0821 257/565 |
| 2013/0339918 A1* | 12/2013 | Clark ...................... | G06F 30/39 716/122 |
| 2014/0007032 A1* | 1/2014 | Acar ................... | G06F 17/5081 716/112 |
| 2015/0067632 A1* | 3/2015 | Chen .................... | G06F 17/5077 716/129 |

(Continued)

*Primary Examiner* — Mohammed Alam

(57) ABSTRACT

Techniques and mechanisms for the use of layout-versus-schematic (LVS) design tools to validate photonic integrated circuit designs. Various implementations employ alternate analysis techniques with LVS analysis tools to perform one or more LVS analysis processes on photonic integrated circuits. These analysis processes may include curvilinear design validation and the associated flow implementations.

18 Claims, 7 Drawing Sheets

(56) References Cited

U.S. PATENT DOCUMENTS

| | | | |
|---|---|---|---|
| 2015/0234964 A1* | 8/2015 | Fu | G06F 17/5045 |
| | | | 716/103 |
| 2016/0055289 A1* | 2/2016 | Cao | G06F 30/398 |
| | | | 716/112 |
| 2016/0097789 A1* | 4/2016 | Clark | G01P 15/125 |
| | | | 73/514.01 |

* cited by examiner

VERIFICATION OF PHOTONIC INTEGRATED CIRCUITS

RELATED APPLICATIONS

This application is a divisional of U.S. patent application Ser. No. 14/693,851, filed on Apr. 22, 2015, entitled "Verification Of Photonic Integrated Circuits" and naming Ruping Cao et al. as inventors, which in turn claims priority under 35 U.S.C. § 119 to U.S. Provisional Patent Application No. 61/982,329, filed on Apr. 22, 2014, entitled "Photonics Design With An EDA Approach: Validation Of Layout Waveguide Interconnects," and naming Ruping Cao as inventor, which is incorporated entirely herein by reference, and which also claims priority under 35 U.S.C. § 119 to U.S. Provisional Patent Application No. 62/151,240, filed on Apr. 22, 2015, entitled "LVS Check For Photonic Integrated Circuits—Curvilinear Feature Extraction And Validation," and naming Ruping Cao et al. as inventors, which is incorporated entirely herein by reference as well.

FIELD OF THE INVENTION

The present invention is directed to the analysis of layout design data representing photonic integrated circuit devices. Various implementations of the invention may be particularly useful for validating a photonic integrated circuit design.

BACKGROUND OF THE INVENTION

Microdevices, such as integrated microcircuits and microelectromechanical systems (MEMS), are used in a variety of products, from automobiles to microwaves to personal computers. Designing and fabricating microdevices typically involves many steps, known as a "design flow." The particular steps of a design flow often are dependent upon the type of microcircuit, its complexity, the design team, and the microdevice fabricator or foundry that will manufacture the microcircuit. Typically, software and hardware "tools" verify the design at various stages of the design flow by running software simulators and/or hardware emulators, and errors in the design are corrected or the design is otherwise improved.

Several steps are common to most design flows for integrated microcircuits. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. Preliminary timing estimates for portions of the circuit may be made at this stage, using an assumed characteristic speed for each device. In addition, the relationships between the electronic devices are analyzed, to confirm that the circuit described by the device design will correctly perform the desired functions. This analysis is sometimes referred to as "formal verification."

Once the relationships between circuit devices have been established, the design is again transformed, this time into a physical design that describes specific geometric elements. This type of design often is referred to as a "layout" design. The geometric elements, which typically are polygons, define the shapes that will be created in various materials to manufacture the circuit. Typically, a designer will select groups of geometric elements representing circuit device components (e.g., contacts, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks.

With a layout design, each physical layer of the circuit will have a corresponding layer representation in the design, and the geometric elements described in a layer representation will define the relative locations of the circuit device components that will make up a circuit device. Thus, the geometric elements in the representation of an implant layer will define the doped regions, while the geometric elements in the representation of a metal layer will define the locations in a metal layer where conductive wires will be formed to connect the circuit devices. In addition to integrated circuit microdevices, layout design data also is used to manufacture other types of microdevices, such as microelectromechanical systems (MEMS). Typically, a designer will perform a number of analyses on the layout design data. For example, with integrated circuits, the layout design may be analyzed to confirm that it accurately represents the circuit devices and their relationships as described in the device design. The layout design also may be analyzed to confirm that it complies with various design requirements, such as minimum spacings between geometric elements. Still further, the layout design may be modified to include the use of redundant geometric elements or the addition of corrective features to various geometric elements, to counteract limitations in the manufacturing process, etc.

In particular, the design flow process may include one or more resolution enhancement technique (RET) processes. These processes will modify the layout design data, to improve the usable resolution of the reticle or mask created from the design in a photolithographic manufacturing process. One such family of resolution enhancement technique (RET) processes, sometimes referred to as optical proximity correction (OPC) processes, may add features such as serifs or indentations to existing layout design data in order to compensate for diffractive effects during a lithographic manufacturing process. For example, an optical proximity correction process may modify a polygon in a layout design to include a "hammerhead" shape, in order to decrease rounding of the photolithographic image at the corners of the polygon.

After the layout design has been finalized, it is converted into a format that can be employed by a mask or reticle writing tool to create a mask or reticle for use in a photolithographic manufacturing process. The written masks or reticles then can be used in a photolithographic process to expose selected areas of a wafer to light or other radiation in order to produce the desired integrated microdevice structures on the wafer.

Silicon photonics, the design of photonic integrated circuits (PICs) on a CMOS platform, has attracted both academic and industrial interest for the possibility of reusing the mature CMOS technology platform that promises high yield and high volume, as well as the potential performance improvement gained by replacing electrons with photons in various application domains. While the conventional design flow process described above is applicable to a variety of microdevices, it is difficult to apply various aspects of this flow to photonic integrated circuits, and the issues of adapting an EDA flow developed for electronic IC designs to the specific needs of PIC designs have not yet been fully addressed.

BRIEF SUMMARY OF THE INVENTION

Aspects of the invention relate to mechanisms for the use of layout-versus-schematic (LVS) design tools to validate photonic integrated circuit designs where the conventional integrated circuit design flow cannot be applied directly to or perform checks that are specific to photonic circuits. Various implementations of the invention employ alternate analysis techniques with LVS analysis tools to perform one or more LVS analysis processes on photonic integrated circuits. These analysis processes may include curvilinear design validation and the associated flow implementations.

Still other aspects of the invention relate to techniques for determining whether each occurrence of a cell in a hierarchical layout design can be uniformly colored for partitioning

DETAILED DESCRIPTION OF THE INVENTION

Illustrative Operating Environment

The execution of various electronic design automation processes according to embodiments of the invention may be implemented using computer-executable software instructions executed by one or more programmable computing devices. Because some embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

Figure 1:
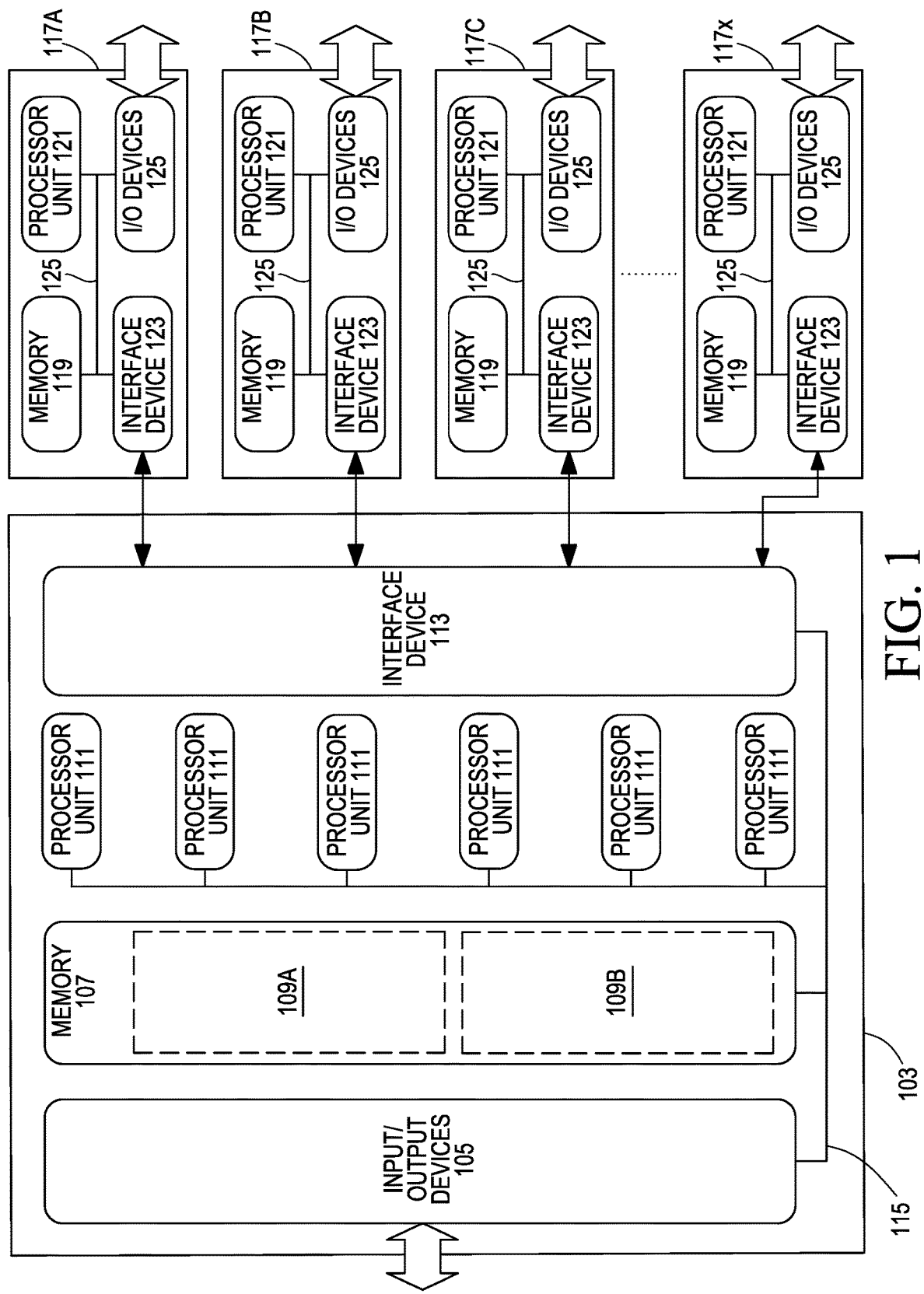
FIGS. 1 and 2 illustrate components of computing device that may be used to implement various embodiments of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may be any suitable type of physical storage device such as, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also be magnetic cassettes, magnetic tapes, magnetic disks or other magnetic storage devices, punched media, holographic storage devices.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
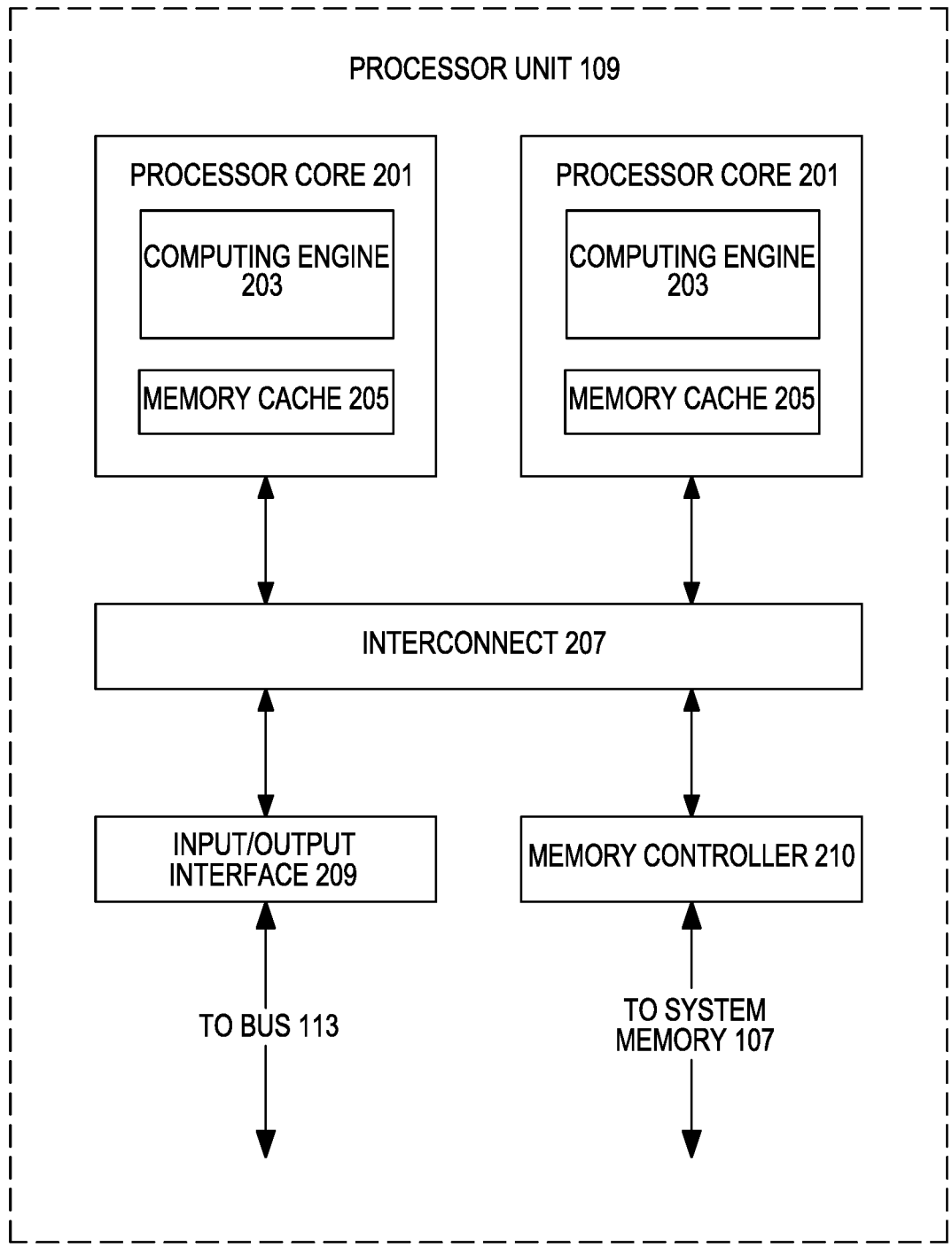
Figure 3A:
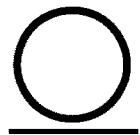
FIGS. 3A-3E illustrate layout representations of well-known photonic integrated circuit devices: a ring resonator, a directional coupler, a grating coupler, a Y-splitter, and a Mach-Zehnder interferometer, respectively.
Figure 3B:
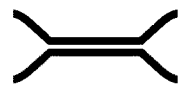
Figure 3C:
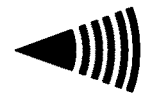
Figure 3D:
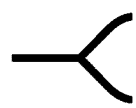
Figure 3E:

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Contrasts Between Photonic and Conventional Integrated Circuit Designs

Typically, a photonic integrated circuit layout design will be run through a design rule check (DRC) process, where physical manufacturability is checked against a set of design rules. As used herein, the term "design" is intended to encompass data describing an entire microdevice, such as an integrated circuit or microelectromechanical system (MEMS) including one or more photonic integrated circuit devices. This term also is intended to encompass a smaller group of data describing one or more components of an entire microdevice, however, such as a layer of an integrated circuit, or even a portion of a layer of an integrated circuit. Still further, the term "design" also is intended to encompass data describing more than one microdevice, such as data to be used to create a mask or reticle for simultaneously forming multiple microdevices on a single wafer. The layout design data may be in any desired format, such as, for example, the Graphic Data System II (GDSII) data format or the Open Artwork System Interchange Standard (OASIS) data format proposed by Semiconductor Equipment and Materials International (SEMI). Other formats include an open source format named Open Access, Milkyway by Synopsys, Inc., and EDDM by Mentor Graphics, Inc.

After the design rule check process, the photonic integrated circuit layout design is submitted to a layout-versus-schematic (LVS) process, to determine if the circuit will behave as desired; that is, whether a layout implementation of a circuit matches the original schematic design. As part of a LVS process on a convention integrated circuit, an electrical rule checking (ERC) process searches for faulty or dangerous electrical connections. An LVS check on photonic designs should be performed for the same purpose.

Conventional electronic devices, such as transistors, are extracted during an LVS process based on their layout features. For example, an overlap of the polysilicon gate layer and the implantation layer can be identified as a transistor instance. With photonic systems, however, many photonic components are built upon a single waveguide design layer. Accordingly, various implementations of the invention may employ recognition layers and text labels to recognize instances of photonic structures.

The differences between conventional integrated circuits and photonic integrated circuits also exist in the definition of their respective devices. Touching or overlap of layout geometries usually means a continuous signal channel in conventional electrical circuits, but not necessarily in optical photonic circuits. For example, for waveguide crossings (electronically shorted and optically open) and directional couplers (electronically open and optically shorted), those structures must be recognized as photonic integrated circuit devices to ensure that the optical signal will travel the correct path via the defined ports. FIGS. 3A-3E illustrate layout representations of well-known photonic integrated circuit devices: a ring resonator, a directional coupler, a grating coupler, a Y-splitter, and a Mach-Zehnder interferometer, respectively.

Beside these difficulties in configuring an LVS tool for photonic device recognition, parameter extraction for photonic devices also is not straightforward due to the curvilinear feature of photonic designs. While conventional integrated circuit device behaviors are characterized by parameters that are measured on Manhattan-like design geometries, such as transistor gate length and width, photonic component design is non-Manhattan, and curvilinear properties such as curvilinear path length and bend curvature are signature features of the components that determine the device function or signal continuity of a waveguide interconnection path.

For example, with respect to path length validation, manipulation of optical interference behavior enables many important photonic device designs, including ring resonators, Mach-Zehnder interferometers and arrayed waveguide gratings (AWG). The key parameter to those devices is the path length difference, which corresponds to an optical path length, and which should therefore be validated. Regarding bend curvature validation, this is an important device parameter for, e.g., a focused grating coupler, which is widely used in photonic integrated circuits. The curvature of the gratings is a design parameter given by the phase difference between the input wave from the fiber and the output focusing wave. Moreover, the geometrical design of bends determines the signal continuity; radiation loss is directly linked to the bend curvature. Curvature thus should be validated to ensure signal integrity, which in this case is in analogous to an ERC check for conventional integrated circuits.

Current EDA tools support layout formats like GDSII and OASIS that describe layout design polygons, which means that curvilinear shapes are rendered into a sequence of straight edges approximating the curve during the discretization process, and the original curve information is lost. Thus the difficulty is in the extraction of curvilinear properties on the polygons, where curvature and path length is not clearly defined.

Photonic Integrated Circuit Device and Connectivity Extraction

Figure 4:
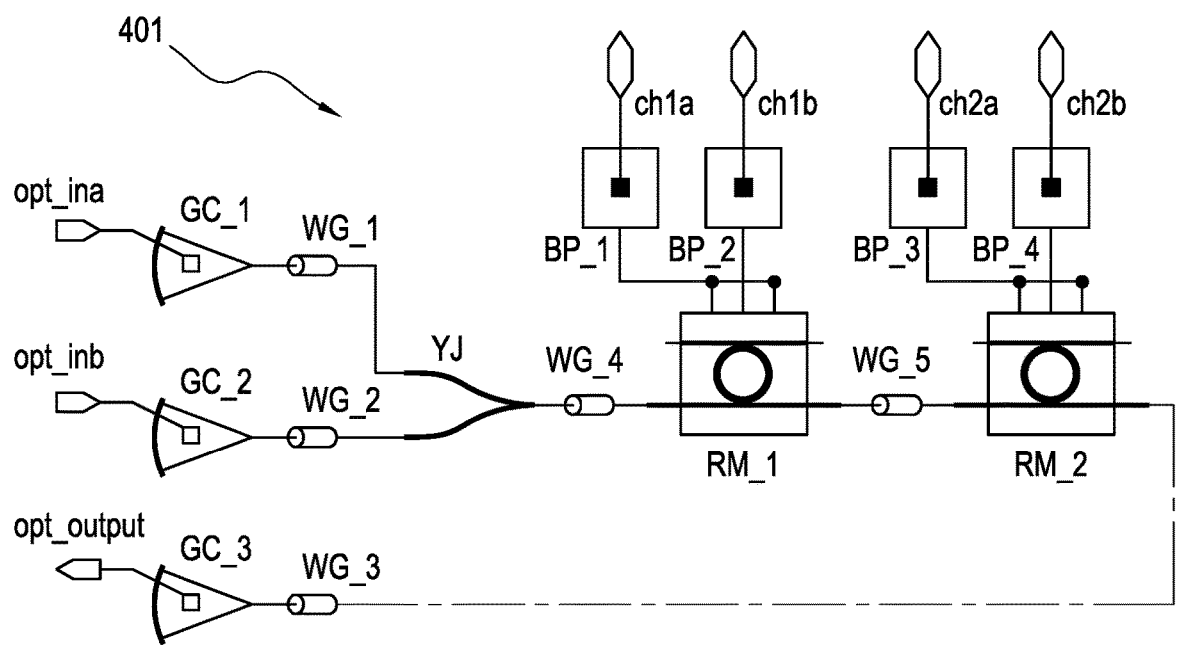
FIGS. 4 and 5 illustrate an example of a photonic integrated circuit that may be analyzed according to various implementations of the invention.

Analysis techniques according to various implementations of the invention may employ a commercially available electronic design automation layout design analysis tool suite to analyze and validate a photonic circuit. An example of the type of photonic integrated circuit that may be analyzed according to various implementations of the invention is illustrated in FIG. 4. As seen in this figure, the photonic integrated circuit 401 includes optical components such as grating couplers (GC) for optical signal access from optical fibers, a Y-junctions (YJ) splitter, ring modulators (RM) for optical signal modulation, bond pads (BP) for electrical signal access, and waveguide (WG) interconnections. It should be noted that a waveguide interconnection is treated as a device, as its optical connectivity needs to be verified based on its geometrical parameters.

According to various implementations of the invention, the implemented layout is extracted and validated for device placement and basic connectivity, employing a conventional rule deck implementation.

Figure 6A:
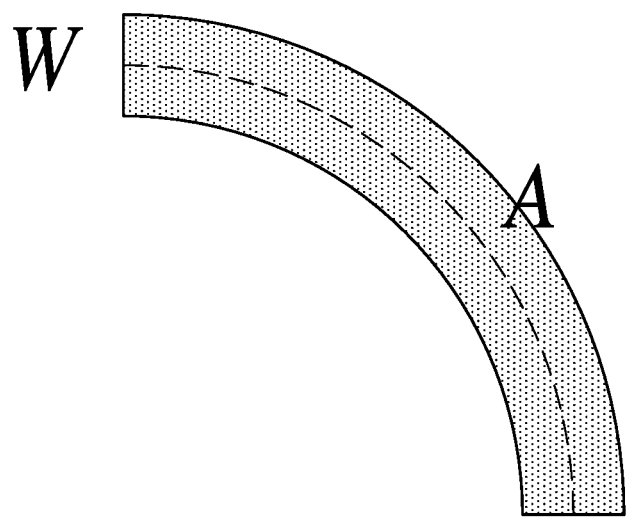
FIGS. 6A and 6B illustrate techniques for determining a length of a contour according to various implementations of the invention.

Next, the curvilinear properties of the photonic devices in the layout data are extracted. More particularly, various implementations of the invention extract properties from the layout curves, and compare them with the reference values specified in the source netlist. This flow is similar to a conventional LVS process, but further includes a measurement algorithm and its flow integration. For example, depending on the design complexity and accuracy requirement, various implementations of the invention may use existing command syntax for a layout-versus-schematic tool to capture the polygon area and width value of a curved structure, as shown in FIG. 6A. As seen in this figure, the central path length L of a constant width waveguide routing can be computed simply by dividing its area A by its width W.

Figure 7A:
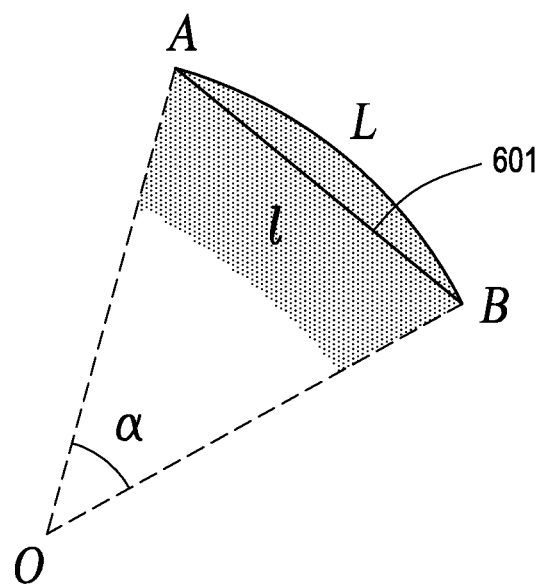
FIGS. 7A and 7B illustrate techniques for determining a radius of curvature of a contour according to various implementations of the invention.

Various implementations of the invention may alternately or additionally determine the radius of curvature (RoC) using conventional layout-versus-schematic analysis tool. On a circular bend such as that shown in FIG. 7A, for example, various implementations of the invention may determine the RoC of the outer contour 601 from the arc length L and the chord length l, which is derived by the captured polygon projection on x axis lx, and on y axis ly. Such expressions can all be coded into the rules for a conventional layout-versus-schematic analysis tool using built-in languages, such as Tcl, and are supported by the existing tools.

Although various implementations of the invention can quickly derive the path length and curvature of a photonic integrated circuit device structure with a conventional layout-versus-schematic analysis tool using its existing syntax, the limitation is obvious: it works on constant width and circular arcs. Depending on the complexity of the described photonic integrated circuit structures, these approximations can satisfy certain designs. However, as more complex designs emerge with variant width routing or arbitrary bends, a more advanced approach will be desirable. Accordingly, various implementations of the invention may alternately or additionally provide a utility that enables further access to the layout database to obtain polygon vertices for measurement.

Figure 6B:
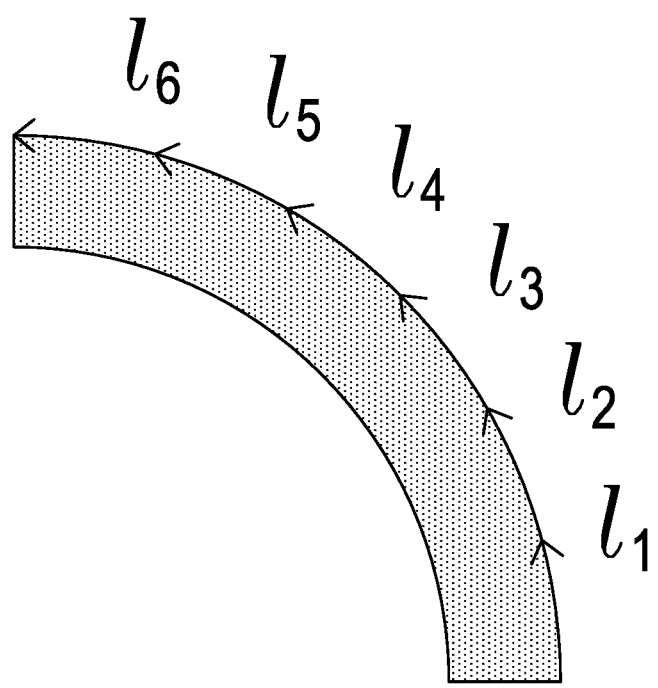

For example, for length calculation, various implementations of the invention may alternately or additionally sum up the length of linear segments $l_1$-$l_i$, which may be determined by applying the Pythagorean theorem to each pair of neighboring polygon vertices, as shown in FIG. 6B. The summation of these linear segments provides the total length L of the side contour. This approach ensures the validity of length extraction for structures with non-constant width or asymmetric shapes.

Similarly, various implementations of the invention may alternately or additionally employ alternate techniques for extracting RoC properties from photonic integrated circuit design data. For example, some implementations of the invention may utilize discrete data directly, and estimate the required properties. Other implementations may alternately or additionally perform interpolations or parameterizations of mathematical objects in the design data, from which the curve properties are then computed. For the purpose of explaining these alternate flow implementations, an osculating circle fitting technique will be described to explain the former approach, and a spline interpolation technique will be described to explain the latter.

Figure 7B:
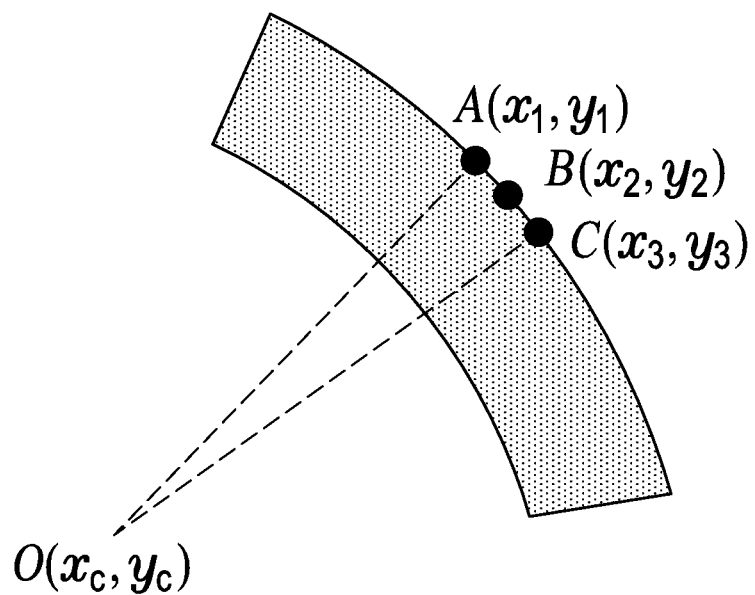

For discrete space direct extraction, based on the osculating circle definition of the curvature on a certain point of the curve, various implementations of the invention will take each group of three points (x1, y1), (x2, y2) and (x3, y3), retrieved in successive manner, from which an osculating circle is defined as shown in FIG. 7B. Running the algorithm through all the points on the curve, the local curvature value of each point is obtained. This local curvature provides the minimum RoC, (which is compared with a minimum value to control against bend loss) and the maximum RoC for comparison with the specified reference values.

In the case of continuous space extraction, various implementations of the invention may employ a spline for interpolation due to its effectiveness in numerical differentiation. The interpolation results in a continuous curve, with each interpolated segment given by a polynomial function, on which the local curvature and path length are easily computed. A suitable interpolation algorithm may be found in, e.g., M. Hazewinkel, Ed., *Encyclopaedia of mathematics: an updated and annotated translation of the Soviet "Mathematical encyclopaedia"*, Dordrecht; Boston: Norwell, Mass., U.S.A: Reidel; Sold and distributed in the U.S.A. and Canada by Kluwer Academic Publishers, 1988.

To avoid the extraction difficulty on discrete polygons, various implementations of the invention may alternately or additionally reconstruct a curve from the source netlist as a reference design, which is then compared with the layout drawn curve. The curve equations or the coefficients of the parametric curve are required for the reconstruction and, to make use of the available SPICE netlist, such information typically will be coded into a format that is highly restricted. Also, curves given by equations must explicitly state their form of function and parameters. With these implementations, however the generated polygon shape is then written onto the layout as the reference design, and the layout curve compared with the reference using the geometrical manipulation, i.e., checking if the layout curve contour falls within the reference one.

Implementation of an Analysis Flow

Figure 5:
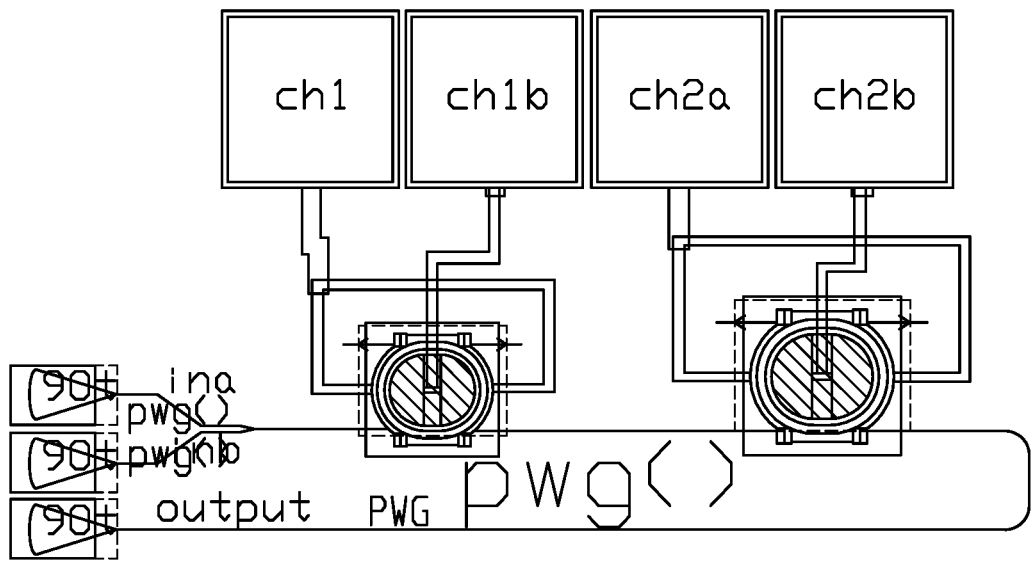

Design flows using various implementations of the invention will now be explained with reference to the example circuits, based on the example photonic integrated circuit layout design shown in FIGS. 4 and 5. Markers are placed on the waveguide bends (BWG) and the waveguide interconnection path which links two optical component pins (PWG), which may or may not be needed in different flows. The minimum and maximum radiuses of curvature are defined among other properties in the waveguide bends device declaration; and minimum and maximum width, and the path length are defined for the component pins.

Figure 8:
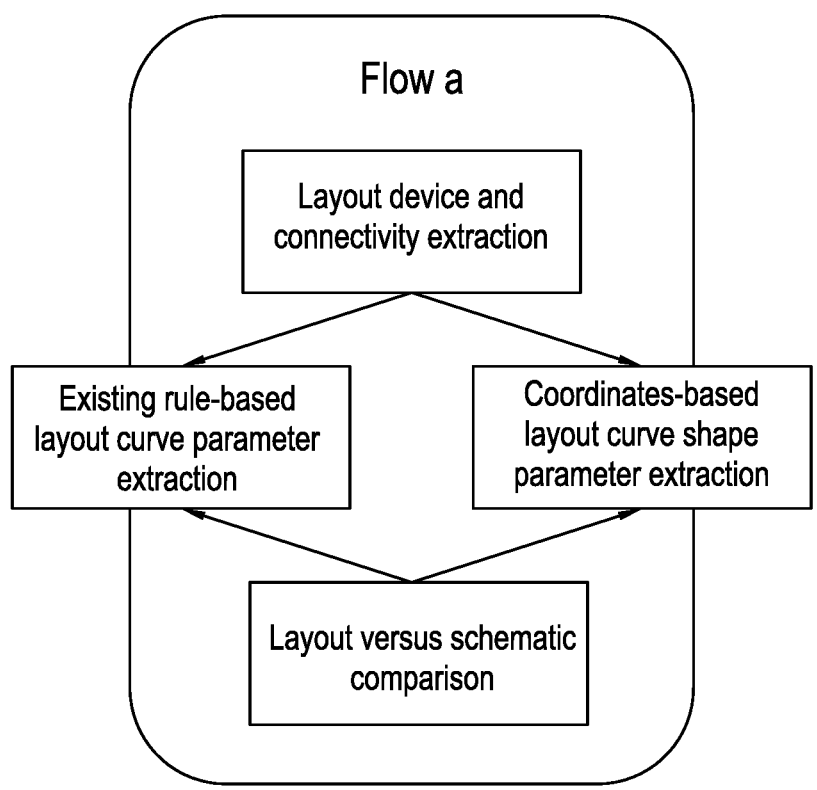
FIGS. 8 and 9 show alternate flows for analyzing a photonic integrated circuit design according to various implementations of the invention.

In a flow A, shown in FIG. 8, an existing rule-based method is implemented according to various embodiments of the invention with the left sub-flow, which requires no modification to a conventional LVS flow. Computation results of the BWG curvature and the PWG length as extracted device parameters are validated against values given in the source netlist.

The right-hand side sub-flow then is implemented according to various embodiments of the invention using coordinate-based property extraction. The curvilinear parameter extraction task is moved to the ERC stage. It is enabled by the Calibre® PERC™ tool (framework available from Mentor Graphics Corporation of Wilsonville, Oreg.), which is a reliability verification and analysis platform for physical layout and logical netlist information.

Figure 9:
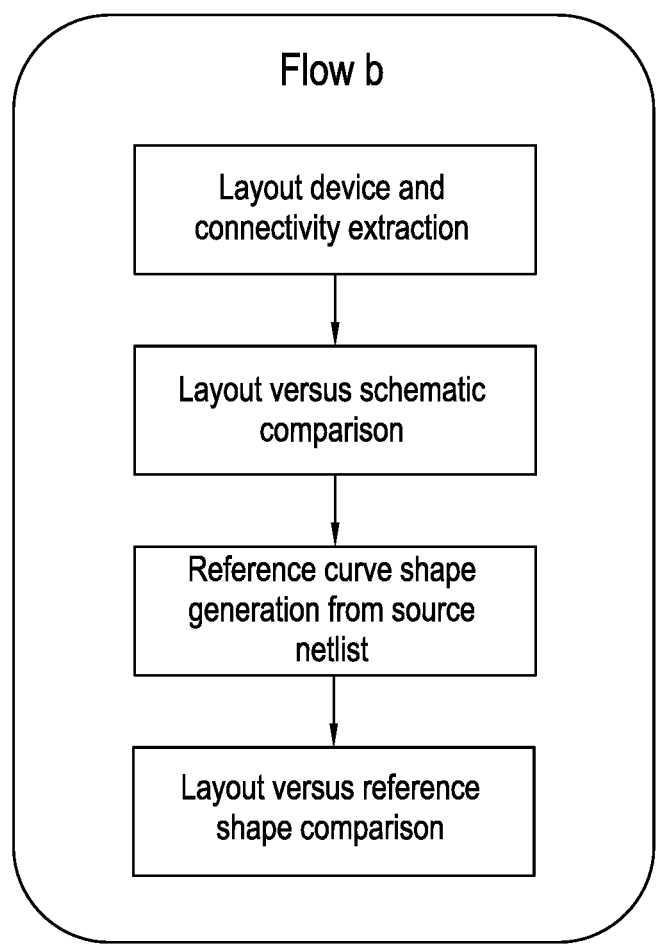

In a flow B, shown in FIG. 9, a shape comparison method is performed. In this flow, the PERC framework also is used to perform source netlist information referencing and manipulation. The reference curve is recovered from the source netlist-specified bend type (circular, sinusoidal), and its corresponding parameters (radius in the circular case, and amplitude, frequency in the sinusoidal case). It is then translated into coordinates and written onto the layout. Finally, the layout drawn curve is compared with the reference curve shape.

For flow B, i.e., the shape comparison flow, curvilinear parameters are not extracted as in flow A. Validation is done by comparison of the layout curve with reference curve geometry. Using the PERC flow, reference curve geometry is recovered from a source netlist (or a complementary file aside to the existing layout format). Therefore, along with the flow modification and algorithm implementation, various implementations of the invention may also provide a curve information storage format to store curve expressions (e.g. in the form of splines), for the sake of physical verification. This is suggested as a future area of study.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method comprising:
by a computing system:
extracting layout data from a design file comprising representations of one or more photonic integrated circuit designs;
constructing a reference curve from reference curve parameters specified in a source netlist, wherein the source netlist specifies the reference curve parameters;
comparing a shape of the reference curve with a curved shape from the extracted layout data, including by checking whether a contour of the curved shape from the extracted layout falls within the shape of the reference curve; and
responsive to the comparing, validating the one or more photonic integrated circuit designs.

2. The method of claim 1, further comprising:
identifying the reference curve parameters from the source netlist;
using the reference curve parameters to translate the reference curve into coordinates; and
writing the coordinates into the extracted layout data.

3. The method of claim 2, wherein the reference curve parameters are stored in a curve information storage format as curve expressions.

4. The method of claim 1, further comprising:
extracting at least one parameter of the curved shape in the layout data using a coordinate-based method; and
comparing the at least one extracted parameter to a rule-based parameter generated by performing rule-based parameter extraction with the layout data.

5. A non-transitory computer-readable medium comprising instructions that, when executed by a processor, cause a computing system to:
extract layout data from a design file comprising representations of one or more photonic integrated circuit designs;
construct a reference curve from reference curve parameters specified in a source netlist, wherein the source netlist specifies the reference curve parameters;
compare a shape of the reference curve with a curved shape from the extracted layout data, including by checking whether a contour of the curved shape from the extracted layout falls within the shape of the reference curve; and
responsive to the comparison, validate the one or more photonic integrated circuit designs.

6. The non-transitory machine-readable medium of claim 5, wherein the instructions, when executed by the processor, further cause the computing system to:
identify the reference curve parameters from the source netlist;
use the reference curve parameters to translate the reference curve into coordinates; and
write the coordinates into the extracted layout data.

7. The non-transitory machine-readable medium of claim 6, wherein one or more parameters of the reference curve are stored in a curve information storage format as curve expressions.

8. The non-transitory machine-readable medium of claim 5, wherein the instructions, when executed by the processor, further cause the computing system to:
extract at least one parameter of the curved shape in the layout data using a coordinate-based method; and
compare the at least one extracted parameter to a rule-based parameter generated by performing rule-based parameter extraction with the layout data.

9. A system comprising:
a processor; and
a non-transitory machine-readable medium comprising executable instructions that, when executed by the processor, cause the processor to:
extract layout data from a design file comprising representations of one or more photonic integrated circuit designs;
construct a reference curve from reference curve parameters specified in a source netlist, wherein the source netlist specifies the reference curve parameters;
compare a shape of the reference curve with a curved shape from the extracted layout data, including by checking whether a contour of the curved shape from the extracted layout falls within the shape of the reference curve; and
responsive to the comparison, validate the one or more photonic integrated circuit designs.

10. The system of claim 9, wherein the executable instructions, when executed by the processor, further cause the processor to:
identify the reference curve parameters from the source netlist;
use the reference curve parameters to translate the reference curve into coordinates; and
write the coordinates into the extracted layout data.

11. The system of claim 10, wherein one or more parameters of the reference curve are stored in a curve information storage format as curve expressions.

12. The system of claim 9, wherein the executable instructions, when executed by the processor, further cause the processor to:
extract at least one parameter of the curved shape in the layout data using a coordinate-based method; and
compare the at least one extracted parameter to a rule-based parameter generated by performing rule-based parameter extraction with the layout data.

13. The method of claim 1, wherein the reference curve parameters specified in the netlist comprise a bend type of the reference curve that specifies a circular bend type or a sinusoidal bend type for the reference curve.

14. The method of claim 13, wherein the reference curve parameters specified in the netlist further comprise corresponding curve parameters that include:
when the bend type specifies the circular bend type:
a radius value of the reference curve; and when the bend type specifies the sinusoidal bend type:
an amplitude value and a frequency value for the reference curve.

15. The non-transitory machine-readable medium of claim 5, wherein the reference curve parameters specified in the netlist comprise a bend type of the reference curve that specifies a circular bend type or a sinusoidal bend type for the reference curve.

16. The non-transitory machine-readable medium of claim 15, wherein the reference curve parameters specified in the netlist further comprise corresponding curve parameters that include:
when the bend type specifies the circular bend type:
a radius value of the reference curve; and
when the bend type specifies the sinusoidal bend type:
an amplitude value and a frequency value for the reference curve.

17. The system of claim 9, wherein the reference curve parameters specified in the netlist comprise a bend type of the reference curve that specifies a circular bend type or a sinusoidal bend type for the reference curve.

18. The system of claim 17, wherein the reference curve parameters specified in the netlist further comprise corresponding curve parameters that include:
when the bend type specifies the circular bend type:
a radius value of the reference curve; and
when the bend type specifies the sinusoidal bend type:
an amplitude value and a frequency value for the reference curve.

* * * * *